United States Patent
Chen et al.

(10) Patent No.: US 10,825,395 B2
(45) Date of Patent: Nov. 3, 2020

(54) ORGANIC LIGHT EMITTING DIODE DISPLAY DEVICE, CIRCUIT AND METHOD FOR DETECTING DRIVING CURRENT THEREOF

(71) Applicants: BOE TECHNOLOGY GROUP CO., LTD., Beijing (CN); HEFEI XINSHENG OPTOELECTRONICS TECHNOLOGY CO., LTD., Anhui (CN)

(72) Inventors: Lei Chen, Beijing (CN); Chen Song, Beijing (CN); Airong Liu, Beijing (CN); Tangxiang Wang, Beijing (CN); Xuelian Cheng, Beijing (CN)

(73) Assignees: BOE TECHNOLOGY GROUP CO., LTD., Beijing (CN); HEFEI XINSHENG OPTOELECTRONICS TECHNOLOGY CO., LTD., Anhui (CN)

( * ) Notice: Subject to any disclaimer, the term of this patent is extended or adjusted under 35 U.S.C. 154(b) by 342 days.

(21) Appl. No.: 15/558,068

(22) PCT Filed: Feb. 17, 2017

(86) PCT No.: PCT/CN2017/073880
§ 371 (c)(1),
(2) Date: Sep. 13, 2017

(87) PCT Pub. No.: WO2018/023963
PCT Pub. Date: Feb. 8, 2018

(65) Prior Publication Data
US 2018/0308428 A1    Oct. 25, 2018

(30) Foreign Application Priority Data
Aug. 5, 2016 (CN) .......................... 2016 1 0641431

(51) Int. Cl.
G09G 3/3258 (2016.01)
G09G 3/3233 (2016.01)
(Continued)

(52) U.S. Cl.
CPC ......... G09G 3/3258 (2013.01); G09G 3/3233 (2013.01); H01L 27/3265 (2013.01);
(Continued)

(58) Field of Classification Search
CPC .. G09G 3/3258; G09G 3/3283; G09G 3/3291; G09G 2320/06; G09G 2330/12;
(Continued)

(56) References Cited

U.S. PATENT DOCUMENTS

| 2004/0100430 | A1 | 5/2004 | Fruehauf |
| 2010/0013502 | A1 | 1/2010 | Kuang |
| 2013/0181111 | A1* | 7/2013 | Jahana ...................... G01J 1/44 250/206 |
| 2014/0240278 | A1 | 8/2014 | Kim et al. |

(Continued)

FOREIGN PATENT DOCUMENTS

| CN | 104424893 A | 3/2015 |
| CN | 105206208 A | 12/2015 |

(Continued)

OTHER PUBLICATIONS

International Search Report and Written Opinion dated May 3, 2017; PCT/CN2017/073880.

(Continued)

*Primary Examiner* — William Boddie
*Assistant Examiner* — Saifeldin E Elnafia (57) ABSTRACT

Disclosed are a circuit and a method for detecting a driving current of an organic light emitting diode display device, and an organic light emitting diode display device, the method includes: after detecting for a predetermined time period, obtaining an output voltage of the integrating circuit, and comparing the output voltage with at least one reference voltage; in the case that the output voltage and the reference (Continued)

voltage satisfy a predetermined condition, adjusting capacitance of a capacitor of the integrating circuit.

14 Claims, 5 Drawing Sheets

(51) Int. Cl.
  *H01L 27/32*    (2006.01)
  *H01L 51/52*    (2006.01)
  *G09G 3/3291*   (2016.01)
  *G09G 3/3283*   (2016.01)

(52) U.S. Cl.
  CPC ...... *H01L 27/3276* (2013.01); *H01L 51/5206* (2013.01); *H01L 51/5221* (2013.01); *G09G 3/3283* (2013.01); *G09G 3/3291* (2013.01); *G09G 2310/0291* (2013.01); *G09G 2320/029* (2013.01); *G09G 2320/06* (2013.01); *G09G 2330/12* (2013.01)

(58) Field of Classification Search
  CPC ......... G09G 3/3233; G09G 2310/0291; G09G 2320/029; H01L 27/3265; H01L 27/3276; H01L 51/5206; H01L 51/5221
  See application file for complete search history.

(56) References Cited

U.S. PATENT DOCUMENTS

| 2014/0374572 | A1* | 12/2014 | Kim | .................... H04N 5/3745 250/208.1 |
|---|---|---|---|---|
| 2015/0061981 | A1 | 3/2015 | Lee et al. | |
| 2015/0379909 | A1 | 12/2015 | Yu et al. | |
| 2015/0379937 | A1 | 12/2015 | Kim et al. | |
| 2016/0012798 | A1 | 1/2016 | Oh et al. | |
| 2016/0104422 | A1 | 4/2016 | Kishi et al. | |

FOREIGN PATENT DOCUMENTS

| CN | 105321455 A | 2/2016 |
|---|---|---|
| CN | 105321456 A | 2/2016 |
| CN | 105339998 A | 2/2016 |
| CN | 106023899 A | 10/2016 |

OTHER PUBLICATIONS

The First Chinese Office Action dated Jun. 20, 2017; Appln. No. 201610641431.5.
The Second Chinese Office Action dated Jan. 25, 2018; Appln. No. 201610641431.5.
Extended European Search Report dated Nov. 20, 2019; Appln. No. 17761426.0.

* cited by examiner

ORGANIC LIGHT EMITTING DIODE DISPLAY DEVICE, CIRCUIT AND METHOD FOR DETECTING DRIVING CURRENT THEREOF

TECHNICAL FIELD

Embodiments of the present disclosure relate to a circuit and a method for detecting a driving current of an organic light emitting diode display device, and an organic light emitting diode display device.

BACKGROUND

With the development of technology, in a pixel circuit of an existing active matrix organic light emitting diode (AMOLED) display device, an organic light emitting diode (OLED) and a thin film transistor (TFT) for driving the OLED may lead to a fluctuation of the driving current of the OLED due to instability in preparation processes, parameter drift, device aging, and etc., which causes uneven luminescence of a display panel. In order to solve a problem of the uneven luminescence, an electric compensation method can be used to compensate the voltage or the current signal applied to the OLED.

SUMMARY

At least one embodiment of the present disclosure provides a method for detecting a driving current of an organic light emitting diode display device by using an integrating circuit, comprising: after detecting for a predetermined time period, obtaining an output voltage of the integrating circuit, and comparing the output voltage with at least one reference voltage; and in the case that the output voltage and the reference voltage satisfy a predetermined condition, adjusting capacitance of a capacitor of the integrating circuit.

For example, in some embodiments of the method, the at least one reference voltage comprises a first reference voltage and a second reference voltage, the second reference voltage is smaller than the first reference voltage; in a case that the output voltage is greater than the first reference voltage, the capacitance of the capacitor of the integrating circuit is reduced; and in a case that the output voltage is smaller than the second reference voltage, the capacitance of the capacitor of the integrating circuit is increased.

For example, in some embodiments of the method, the capacitor of the integrating circuit is a variable capacitor, the variable capacitor comprises a plurality of sub-capacitors which are connected with each other in parallel, in series or in series-parallel, and at least one of the plurality of sub-capacitors is configured to be connected to the variable capacitor or disconnected from the variable capacitor.

For example, in some embodiments of the method, in the case that the output voltage is greater than the first reference voltage, a set first flag bit is used to represent a comparison result, then a corresponding sub-capacitor is disconnected or connected according to information indicated by the comparison result; and in the case that the output voltage is smaller than the second reference voltage, a set second flag bit is used to represent the comparison result, then the corresponding sub-capacitor is disconnected or connected according to the information indicated by the comparison result.

For example, in some embodiments, the method further comprises: adjusting at least one among capacitance of the sub-capacitor of the variable capacitor, the first reference voltage and the second reference voltage, so as to adjust a discharge time of the integrating circuit.

At least one embodiment of the present disclosure further provides a circuit used for detecting a driving current of an organic light emitting diode display device, comprising: an integrating circuit and a comparison circuit; the integrating circuit comprises an operational amplifier and a variable capacitor, the variable capacitor is connected between an inverting input end and an output end of the operational amplifier; the comparison circuit is connected to the integrating circuit to receive an output voltage of the integrating circuit, and the comparison circuit is configured to compare the output voltage with a reference voltage and output a comparison result which is used to adjust capacitance of the variable capacitor.

For example, in some embodiments of the circuit, the variable capacitor comprises a plurality of sub-capacitors. The plurality of sub-capacitors are connected with each other in parallel, in series or in series-parallel, and at least one of the plurality of sub-capacitors is configured to be disconnected from the variable capacitor or connected to the variable capacitor.

For example, in some embodiments of the circuit, the variable capacitor further comprises at least one switch element, and the switch element is connected with a corresponding sub-capacitor in series or in parallel.

For example, in some embodiments of the circuit, the switch element is a transistor switch element.

For example, in some embodiments of the circuit, the variable capacitor of the integrating circuit further comprises at least one sub-capacitor which is directly connected between the inverting input end and the output end of the operational amplifier.

For example, in some embodiments of the circuit, the comparison circuit comprises a first comparator, the first comparator is configured to compare the output voltage of the integrating circuit with a first reference voltage.

For example, in some embodiments of the circuit, a non-inverting input end of the first comparator is configured to input the first reference voltage, and an inverting input end of the first comparator is configured to input the output voltage of the integrating circuit.

For example, in some embodiments of the circuit, the comparison circuit further comprises a second comparator, the second comparator is configured to compare the output voltage of the integrating circuit with a second reference voltage.

For example, in some embodiments of the circuit, an inverting input end of the second comparator is configured to input the second reference voltage, and a non-inverting input end of the second comparator is configured to input the output voltage of the integrating circuit.

For example, in some embodiments of the circuit, the circuit used for detecting the driving current of the organic light emitting diode display device further comprises a control circuit; the control circuit is configured to adjust the capacitance of the variable capacitor according to the comparison result outputted by the comparison circuit.

For example, in some embodiments of the circuit, the circuit used for detecting the driving current of the organic light emitting diode display device further comprises a control circuit; the control circuit is configured to adjust the size of the variable capacitor according to the comparison result outputted by the comparison circuit.

For example, in some embodiments of the circuit, an output end of the first comparator or an output end of the second comparator is used to output a flag bit data; and the control circuit is configured to receive the flag bit data and adjusts the capacitance of the variable capacitor according to the flag bit data.

At least one embodiment of the present disclosure further provides an organic light emitting diode display device, comprising: an organic light emitting diode and a circuit used for detecting a driving current of the organic light emitting diode display device. The circuit is configured for detecting the driving current of the organic light emitting diode.

For example, in some embodiments of the organic light emitting diode display device, the organic light emitting diode display device further comprises a detecting switch transistor; and the detecting switch transistor is disposed between the organic light emitting diode and the circuit configured for detecting the driving current of the organic light emitting diode display device.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the present disclosure, are not intended to indicate any sequence, amount or importance, but distinguish various components. The terms "comprise," "include," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly.

Figure 1A:
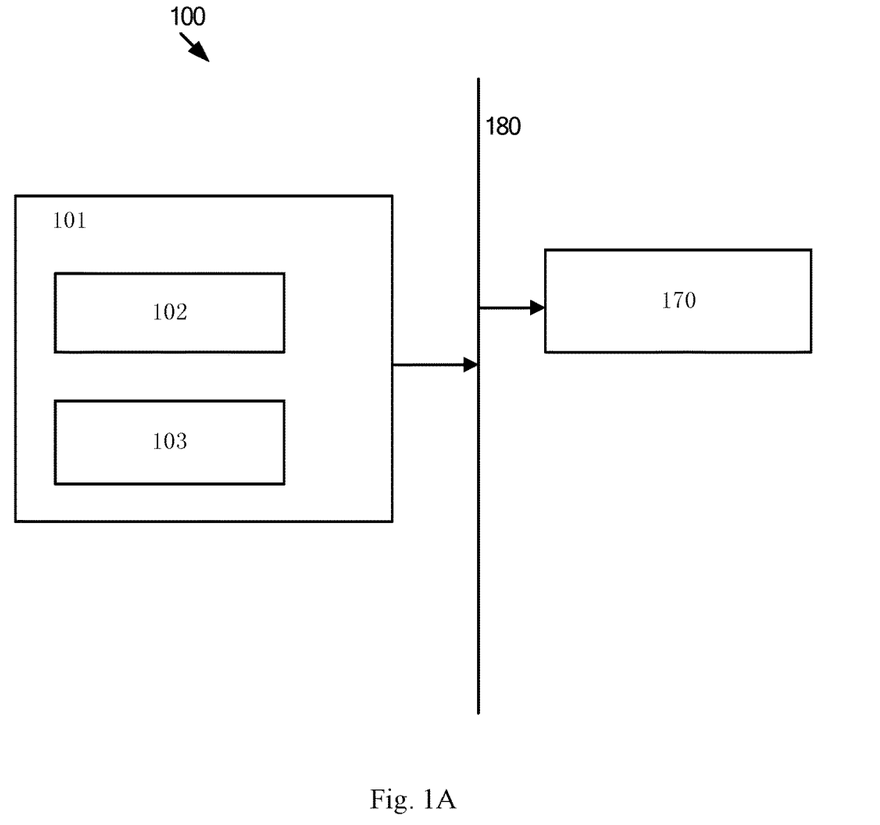
FIG. 1A is an application scenario schematic diagram of a method or a device used for detecting a driving current of an organic light emitting diode display device provided by an embodiment of the present disclosure.

FIG. 1A is an application scenario schematic diagram of a method or a device used for detecting a driving current of an organic light emitting diode display device provided by an embodiment of the present disclosure. The organic light emitting diode (OLED) display device 100 comprises a plurality of sub-pixels, each of the sub-pixels comprises an OLED pixel circuit 101, and the OLED display device 100 further comprises a sense line 180 and a circuit 170 for detecting a driving current of the OLED.

The OLED pixel circuit 101 as illustrated in FIG. 1A also comprises an OLED pixel driving circuit 102 and an organic light emitting diode (OLED) 103, and the organic light emitting diode 103 is controlled and driven by the OLED pixel driving circuit 102.

Figure 1B:
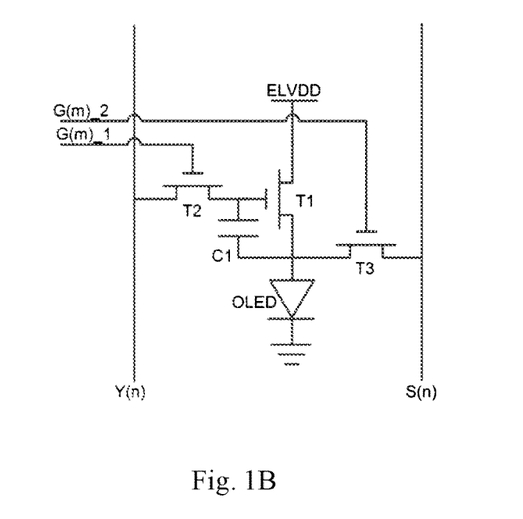
FIG. 1B is a schematic diagram of a pixel circuit included in an application scenario provided by an embodiment of the present disclosure.

FIG. 1B provides an example of a sub-pixel at the (m)th rows and the (n)th columns, each of the sub-pixels comprises a pixel driving circuit (corresponding to the pixel driving circuit 102 in FIG. 1A) comprising a driving transistor T1, a scan switch transistor T2, a sense switch transistor T3, a capacitor C1, a data line Y(n), a first scan line G(m)_1, a second scan line G(m)_2 and a power line ELVDD, and comprises a sense line S(n) (corresponding to the sense line 180 in FIG. 1A) and an OLED device (corresponding to the organic light emitting diode 103 in FIG. 1A). However, those skilled in the art should be understood that the present disclosure is not limited to the specific sub-pixel circuit illustrated in FIG. 1B, the sub-pixel circuit of the embodiments of present disclosure may also have other forms, provided that the sub-pixel circuit can sense the relevant characteristics of the driving transistor and/or the OLED device.

Referring to FIG. 1B, the exemplary OLED pixel circuit 101 comprises an OLED pixel driving circuit and an organic light emitting diode (OLED). The organic light emitting diode emits light according to a current provided by the driving transistor T1. An anode of the organic light emitting diode may be connected to a source electrode of the driving transistor T1, and a cathode of the OLED may be grounded.

The organic light emitting diode may comprise the anode, a hole transport layer, an organic light emitting layer, an electron transport layer, and the cathode. If a voltage is applied across the anode and the cathode of the organic light emitting diode, holes and electrons are moved to the organic light emitting layer through the hole transport layer and the electron transport layer respectively, and are recombined with each other in the organic light emitting layer so as to excite to emit light.

The driving transistor T1 is disposed between the first power line ELVDD and the organic light emitting diode. The driving transistor T1 controls the current flowing from the first power line ELVDD to the OLED according to the voltage difference applied between the gate electrode and the source electrode of the driving transistor T1. The gate electrode of the driving transistor T1 may be connected to the first electrode of the scan switch transistor T2, the source electrode of the driving transistor T1 may be connected to the anode of the organic light emitting diode, and the drain electrode of the driving transistor T1 may be connected to the first power line ELVDD which is provided with a first supply voltage.

The gate electrode of the scan switch transistor T2 is connected to the (m)th first scan line G(m)_1, and thus the scan switch transistor T2 can be switched on or off by a scan pulse over the first scan line G(m)_1, so as to provide an image data voltage over the (n)th data line Y(n) to the gate electrode of the driving transistor T1. A first electrode (such as the drain electrode) of the scan switch transistor T2 may be connected to the gate electrode of the driving transistor T1, and a second electrode (such as the source electrode) of the scan switch transistor T2 may be connected to the (n)th data line Y(n).

The gate electrode of the sense switch transistor T3 is connected to the (m)th second scan line G(m)_2, and thus the sense switch transistor T3 can be switched on or off by a sense pulse over the second scan line G(m)_2, so as to connect the (n)th sense line S(n) to the source electrode of the driving transistor T1. A first electrode (such as the source electrode) of the sense switch transistor T3 may be connected to the (n)th sense line S(n), and a second electrode (such as the drain electrode) of the sense switch transistor T3 may be connected to the source electrode of the driving transistor T1.

The capacitor C1 is disposed between the gate electrode and the source electrode of the driving electrode T1. The capacitor C1 stores the voltage difference between the gate electrode and the source electrode of the driving transistor T1.

As illustrated in FIG. 1B, the driving transistor T1, the scan switch transistor T2, and the sense switch transistor T3 can be formed by an N type MOSFET (metal oxide semiconductor field effect transistor), but are not limitative herein. In another example, the driving transistor T1, the scan switch transistor T2, and the sense switch transistor T3 can be formed by a P type MOSFET. In addition, it should be noted that, in the above mentioned transistor T2 and T3, one of the first electrode and the second electrode may be a source electrode, and correspondingly the other may be a drain electrode.

The circuit 170 for detecting the driving current of the OLED provided by an embodiment of the present disclosure receives an output current of the sense line and then detects the current flowing through the driving circuit of the OLED display device, so as to avoid problems, such as TFT threshold voltage drift or incorrect switching due to an unexpected current caused by an open circuit or short circuit, etc. And according to the measured current, the circuit 170 for detecting the driving current of the OLED display device provided by an embodiment of the present disclosure can adopt three manners, such as reducing the capacitance of the variable capacitor, increasing the capacitance of the variable capacitor or not changing the capacitance of the variable capacitor, to make the discharge time of the integrating circuit be in a reasonable range, so as to greatly improve the ability of the integrating circuit for sampling the current flowing through the OLED.

The circuit 170 used for detecting the driving current of the OLED display device and connected to the above mentioned OLED pixel circuit 101 will be described in detail in combination with FIG. 2-FIG. 7 below.

Figure 2:
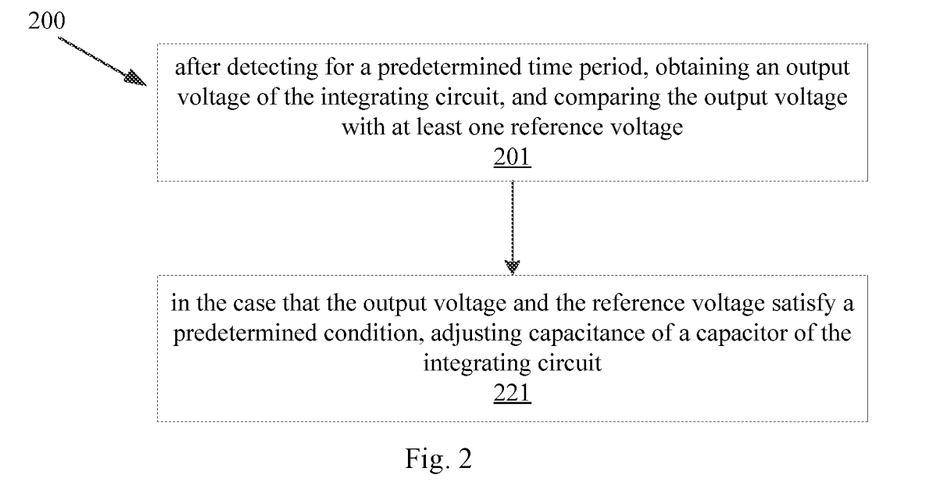
FIG. 2 is a flow chart of a method for detecting a driving current of an organic light emitting diode display device by using an integrating circuit provided by an embodiment of the present disclosure.

FIG. 2 illustrates a method 200 for detecting the driving current of an OLED display device by using an integrating circuit provided by an embodiment of the present disclosure. The exemplary method 200 comprises the following operations:

Step 201, after detecting for a predetermined time period, obtaining an output voltage of the integrating circuit, and comparing the output voltage with at least one reference voltage; and Step 211, in the case that the output voltage and the reference voltage satisfy a predetermined condition, adjusting capacitance of a capacitor of the integrating circuit.

Figure 3:
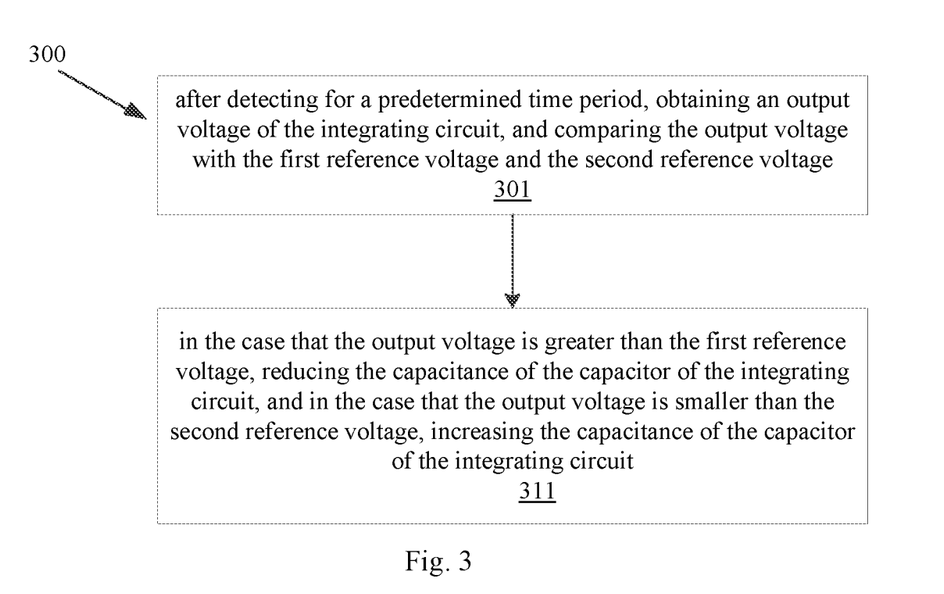
FIG. 3 is a flow chart of another method for detecting a driving current of an organic light emitting diode display device by using an integrating circuit provided by an embodiment of the present disclosure.

In some embodiments, the at least one reference voltage comprises a first reference voltage and a second reference voltage, and the second reference voltage is smaller than the first reference voltage. At this time, a method for detecting the driving current of the OLED by using the integrating circuit may be illustrated in FIG. 3. Referring to FIG. 3, the method 300 for detecting the driving current of the OLED by using the integrating circuit comprises the following operations:

Step 301, after detecting for a predetermined time period, obtaining an output voltage of the integrating circuit, and comparing the output voltage with the first reference voltage and the second reference voltage;

Step 311, in the case that the output voltage is greater than the first reference voltage, reducing the capacitance of the capacitor of the integrating circuit; and in the case that the output voltage is smaller than the second reference voltage, increasing the capacitance of the capacitor of the integrating circuit.

Because the integrating circuit is a discharge circuit, the output voltage of the integrating circuit changes from high to low. Therefore, if the output voltage is greater (namely, the output voltage is greater than the first reference voltage after the predetermined time period) at the same comparison time, the voltage variation of the output voltage is smaller after the same discharge time, furthermore it shows that the driving current is smaller, namely the discharge speed of the integrating circuit is slower than the expected discharge speed, so the capacitance of the capacitor of the integrating circuit needs to be reduced to achieve the technical purpose of accelerating the discharge speed of the integrating circuit. In addition, if the output voltage is smaller (namely, the output voltage is smaller than the second reference voltage after the predetermined time period) at the same comparison time, the voltage variation of the output voltage is greater after the same discharge time, furthermore it shows that the driving current is greater, namely the discharge speed of the integrating circuit is higher than the expected discharge speed, so the capacitance of the capacitor of the integrating circuit needs to be increased to achieve a technical purpose of slowing down the discharge speed of the integrating circuit.

In some embodiments, the capacitor of the integrating circuit is a variable capacitor, the variable capacitor comprises a plurality of sub-capacitors which are connected with each other in parallel, in series or in series-parallel, and at least one of the plurality of sub-capacitors is configured to be connected to the variable capacitor or be disconnected from the variable capacitor.

In some embodiments, in the case that the output voltage is greater than the first reference voltage, a set first flag bit (not illustrated in Figure) is used to represent the comparison result, then a corresponding sub-capacitor is disconnected or connected according to the information indicated by the comparison result; and in the case that the output voltage is smaller than the second reference voltage, a set second flag bit is used to represent the comparison result, then the corresponding sub-capacitor is disconnected or connected according to the information indicated by the comparison result.

In some embodiments, the above mentioned method 200 and method 300 for detecting the driving current of an OLED by using the integrating circuit may further comprise adjusting at least one among the capacitance of the sub-capacitors of the variable capacitor, the first reference voltage and the second reference voltage, and then adjusting the discharge time of the integrating circuit.

Figure 4:
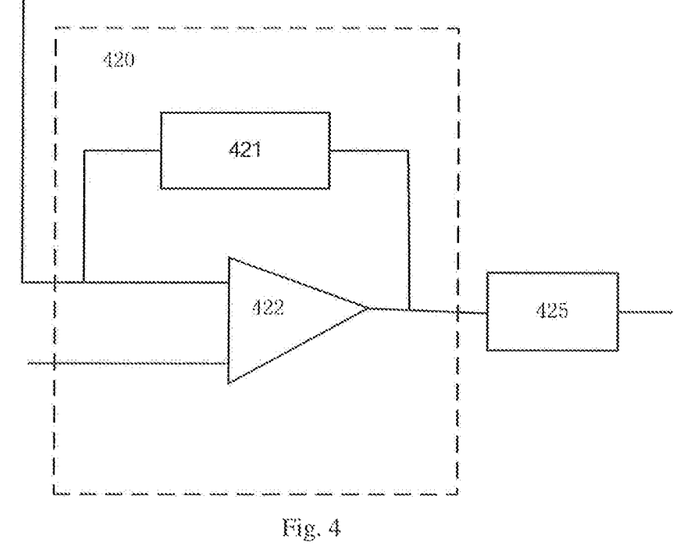
FIG. 4 is a schematic diagram of a circuit used for detecting a driving current of an organic light emitting diode display device provided by an embodiment of the present disclosure.

FIG. 4 illustrates a circuit 400 used for detecting the driving current of the OLED provided by an embodiment of the present disclosure. The circuit 400 used for detecting the driving current of the OLED as illustrated in FIG. 4 comprises an integrating circuit 420 and a comparison circuit 425. The integrating circuit 420 in turn comprises an operational amplifier 422 and a variable capacitor 421, the variable capacitor 421 is connected between an input end and an output end of the operational amplifier 422, for example, the variable capacitor 421 may be connected between an inverting input end and an output end of the operational amplifier 422. The comparison circuit 425 is connected to the integrating circuit 420, and an input end of the comparison circuit 425 is used for receiving an output voltage of the integrating circuit 420. In addition, the comparison circuit 425 is further configured to compare the output voltage of the integrating circuit 420 with a reference voltage set by the comparison circuit 425 and output a comparison result, and the comparison result is used to adjust the capacitance of the variable capacitor 421.

The variable capacitor 421 comprises a plurality of sub-capacitors, the plurality of sub-capacitors are connected with each other in parallel, in series or in series-parallel, and at least one of the plurality of sub-capacitors is configured to be disconnected from the variable capacitor 421 or be connected to the variable capacitor 421. For example, the variable capacitor 421 may comprise three sub-capacitors. Each of the three sub-capacitors can be connected to the integrating circuit or be disconnected from the integrating circuit independently.

In some embodiments, the variable capacitor 421 further comprises at least one switch element, and the switch element is connected with a corresponding sub-capacitor in series or in parallel. For example, in the case that the variable capacitor 421 comprises four parallel sub-capacitors, each of the four parallel sub-capacitors may be connected to or be disconnected from the variable capacitor (namely, the integrating circuit) by a switch element connected thereto in series.

For example, the switch element is a transistor switch element. For example, the transistor switch element may further comprise a P type switch transistor or an N type switch transistor.

In some embodiments, the variable capacitor 421 of the integrating circuit 420 may further comprise at least one sub-capacitor which is directly connected between the inverting input end and the output end of the operational amplifier. For example, the capacitance value of the sub-capacitor is fixed.

In some embodiments, the comparison circuit 425 comprises a first comparator, the first comparator is configured to compare the output voltage of the integrating circuit 420 with the first reference voltage. For example, the first comparator is a circuit which compares an analog voltage signal (namely the output voltage of the integrating circuit) with a reference voltage (namely the first reference voltage), and two inputs of the first comparator are analog signals, while an output is a binary signal. Moreover, in order to avoid oscillation of the output, the first comparator may further be provided with an internal hysteresis circuit. The first comparator may be an operational amplifier with a magnification factor close to "infinity". The first comparator can be configured to compare the sizes of two voltages (the high or low level of the output voltage is used to indicate the size relationship of the two input voltages), in the case that the voltage of the "+" input end of the first comparator is higher than the voltage of the "−" input end thereof, the first comparator outputs a high level; and in the case that the voltage of the "+" input end of the first comparator is lower than the voltage of the "−" input end thereof, the first comparator outputs a low level. The embodiments of the present disclosure are not limitative herein, and an opposite output level can be set to indicate that the voltages of the two input end are high or low.

In some embodiments, a non-inverting input end of the first comparator is used to input the first reference voltage, and an inverting input end of the first comparator is used to input the output voltage of the integrating circuit 420.

In some embodiments, the comparison circuit 425 may further comprise a second comparator; the second comparator is configured to compare the output voltage of the integrating circuit with the second reference voltage. The second comparator and the first comparator are in similar structures, and the specific structure of the second comparator can be referred to the above relevant description of the first comparator, which will not be elaborated herein.

In some embodiments, an inverting input end of the second comparator is used to input the second reference voltage, and a non-inverting input end of the second comparator is used to input the output voltage of the integrating circuit 420.

In some embodiments, the circuit 400 used for detecting the driving current of the OLED can further comprise a control circuit (not illustrated in drawings), and the control circuit is configured to adjust the capacitance of the variable capacitor 421 according to the comparison result outputted by the comparison circuit 425. For example, in some embodiments, the output end of the first comparator or the output end of the second comparator is used to output a flag bit data (not illustrated in drawings); the control circuit receives the flag bit data and adjust the capacitance of the variable capacitor 421 according to the flag bit data.

FIGS. 5 to 8 illustrate three specific embodiments provided by the present disclosure. The three specific embodiments take two reference voltages, two comparators and a variable capacitor including two sub-capacitors as an example to describe in detail the structure of the circuit used for detecting the driving current of the OLED. However, the technical solution of the present disclosure is not limited to two reference voltages, and for example, one reference voltage may be provided. The technical solution of the present disclosure is also not limited to two comparators, and for example, as for a circuit provided with one reference voltage, one comparator may be provided. In addition, the technical solution of the present disclosure is not limited to the situation that a variable capacitor only comprises two sub-capacitors. For example, the variable capacitor 421 may comprise three or more sub-capacitors.

Figure 5:
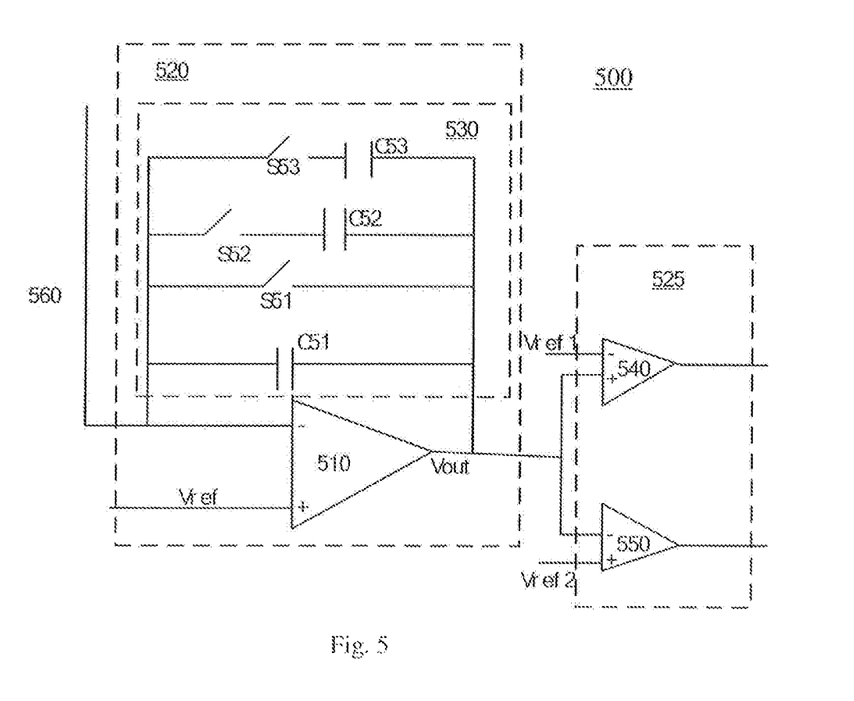
FIG. 5 is a schematic diagram of a circuit used for detecting a driving current of an organic light emitting diode display device based on a parallel connection variable capacitor circuit provided by an embodiment of the present disclosure.

As illustrated in FIG. 5, an example of a circuit 500 used for detecting the driving current of the OLED comprises an integrating circuit 520 and a comparison circuit 525.

The integrating circuit 520 comprises an operational amplifier 510 and a variable capacitor 530, and the variable capacitor 530 is connected between an inverting input end and an output end of the operational amplifier 510. The variable capacitor 530 comprises a first sub-capacitor C51 and a first switch S51. The first switch S51 and the first sub-capacitor C51 both are connected between the inverting input end and the output end of the operational amplifier 510. The variable capacitor 530 further comprises a second sub-capacitor C52, a second switch S52 connected with the second sub-capacitor C52 in series, a third sub-capacitor C53, and a third switch S53 connected with the third sub-capacitor C53 in series. The second sub-capacitor C52 and the third sub-capacitor C53 are connected with the first sub-capacitor C51 in parallel. In addition, the inverting input end of the operational amplifier 510 is connected with a sense line 560. When the first switch S51 is turned on, the first sub-capacitor C51 is short-circuited. When the second switch S52 is turned off or turned on, the second sub-capacitor C52 is disconnected from or connected to the variable capacitor 530 correspondingly. Similarly, when the third switch S53 is turned off or turned on, the third sub-capacitor C53 is disconnected from or connected to the variable capacitor 530 correspondingly.

The comparison circuit 525 as illustrated in FIG. 5 comprises a first comparator 540 and a second comparator 550. An inverting input end of the first comparator 540 inputs a first reference voltage Vref1, a non-inverting input end of the second comparator 550 inputs a second reference voltage Vref2, and the first reference voltage Vref1 is greater than the second reference voltage Vref2.

The comparison circuit 525 is connected to an output end of the integrating circuit 520. In particular, a non-inverting input end of the first comparator 540 and an inverting input end of the second comparator 550 are connected to the output end of the operational amplifier 510, so as to receive the output voltage of the integrating circuit 520. The first comparator 540 and the second comparator 550 are configured to compare a respective reference voltage with the output voltage of the integrating circuit 520 respectively, so as to obtain comparison results.

For example, the detail work process of the above mentioned circuit 500 used for detecting the driving current of the OLED display device is described below. At the beginning time, the first switch S51 and the second switch S52 are turned on. The output voltage of the operational amplifier 510 is equal to the input voltage Vref of the non-inverting input end of the operational amplifier 510. At the beginning of sampling, the first switch S51 is turned off, in the sub-pixel of the display device, the driving current of the driving transistor charges the parallel capacitor formed of the first sub-capacitor C51 and the second sub-capacitor C52 through a sense transistor, and then the output voltage of the operational amplifier 510 begins to decrease from the input voltage Vref.

After a predetermined time period T1, the output voltage Vout of the operational amplifier 510 is compared with the first reference voltage Vref1 and the second reference voltage Vref2. If the output voltage Vout is smaller than the second reference voltage Vref2, it shows that the driving current is too large, and if the manner of the combination of the first sub-capacitor C51 and the second sub-capacitor C52 is still adopted, the discharge time of the integrating circuit 520 is shorter, which exceeds the conversion capability of the analog to digital conversion circuit. Therefore, at this time the third switch S53 is turned on, the discharge capacitor of the integrating circuit 520 is converted into the way in which the first sub-capacitor C51, the second sub-capacitor C52 and the third sub-capacitor C53 are connected with each other in parallel, and the discharge time of the corresponding integrating circuit 520 is increased.

Correspondingly, if the output voltage Vout is greater than the reference voltage Vref1, it is shown that the driving current is smaller and the discharge time is too long. Therefore, at this time the second switch S52 is turned off, then the discharge capacitor of the integrating circuit 520 changes from the manner of the combination of the first sub-capacitor C51 and the second sub-capacitor C52 to the manner of the first sub-capacitor C51 only, so that the discharge time of the integrating circuit 520 is shorten.

If the output voltage Vout is between the first reference voltage Vref1 and the second reference voltage Vref2, it is shown that the driving current is at an intermediate value, the discharge capacitor of the integrating circuit 520 keeps the capacitance value at the beginning of sampling time (namely, the discharge capacitor of the integrating circuit 520 maintains the sum of the capacitances of the first sub-capacitor C51 and the second sub-capacitor C52).

Figure 6:
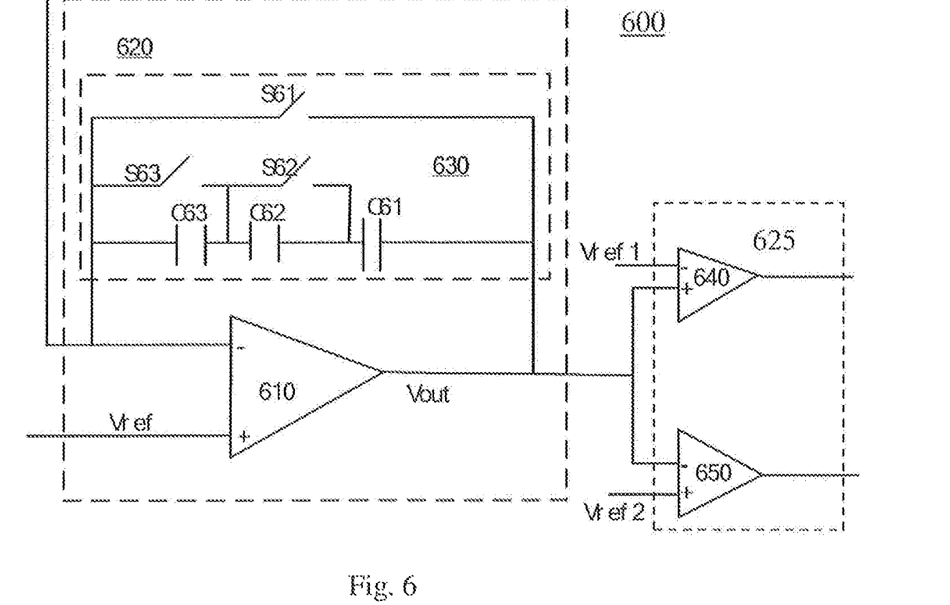
FIG. 6 is a schematic diagram of a circuit used for detecting a driving current of an organic light emitting diode display device based on a series-connected variable capacitor circuit provided by an embodiment of the present disclosure.

As illustrated in FIG. 6, an example of a circuit 600 used for detecting the driving circuit of the OLED comprises an integrating circuit 620 and a comparison circuit 625. Compared with the example as illustrated in FIG. 5, the variable capacitor as illustrated in FIG. 6 comprises two sub-capacitors which are connected with each other in series.

The integrating circuit 620 comprises an operational amplifier 610 and a variable capacitor 630. The comparison circuit 625 comprises a first comparator 640 and a second comparator 650. The first comparator 640 and the second comparator 650 may have the same structures as the two comparators as illustrated in FIG. 5.

The difference between the integrating circuit 620 as illustrated in FIG. 6 and the integrating circuit 520 as illustrated in FIG. 5 is the circuit structure of the variable capacitor. The variable capacitor 630 comprises a first switch S61, a first sub-capacitor C61, a second sub-capacitor C62, a second switch S62 connected with the second sub-capacitor C62 in parallel, a third sub-capacitor C63, and a third switch S63 connected with the third sub-capacitor C63 in parallel. The second sub-capacitor C62, the third sub-capacitor C63 and the first sub-capacitor C61 are connected between the inverting input end and the output end of the operational amplifier in series.

The comparison circuit 625 as illustrated in FIG. 6 has the same connection relationship as the comparison circuit 525 as illustrated in FIG. 5. And the connection relationship between the comparison circuit 625 and the integrating circuit 620 is also the same as that of the corresponding units in FIG. 5.

For example, the detail work process of the above mentioned circuit 600 used for detecting the driving current of the OLED is described below. At the beginning time, the first switch S61 and the third switch S63 are turned on, and an output voltage of the operational amplifier 610 is equal to an input voltage Vref of the non-inverting input end thereof. At the beginning of sampling, the first switch S61 is turned off, in the sub-pixel of the OLED display device, the driving current of the driving transistor charges a series capacitor formed of the first sub-capacitor C61 and the second sub-capacitor C62 by a sense transistor, and then the output voltage of the operational amplifier 610 begins to decrease from the input voltage Vref. After the predetermined time period T1, the output voltage Vout of the operational amplifier 610 is compared with the first reference voltage Vref1 and the second reference voltage Vref2. If the output voltage Vout is smaller than the second reference voltage Vref2 at this time, it is shown that the driving current is too large. Therefore, at this time the second switch S62 are turned on to short the second sub-capacitor C62, then the discharge capacitor of the corresponding integrating circuit 620 changes into a manner of the first sub-capacitor C61 only, and accordingly the discharge time of the integrating circuit 620 is increased.

Correspondingly, if the output voltage Vout is greater than the reference voltage Vref1, it is shown that the discharge time is too long. Therefore, at this time the third switch S63 is turned off, the discharge capacitor of the corresponding integrating circuit 620 changes into a series capacitor formed of the first sub-capacitor C61, the second sub-capacitor C62, and the third sub-capacitor C63, and then the discharge time of the corresponding integrating circuit 620 is shortened.

If the output voltage Vout is between the first reference voltage Vref1 and the second reference voltage Vref2, it is shown that the driving current is at an intermediate value, the discharge capacitor of the corresponding integrating circuit 620 keeps the capacitance value at the beginning of sampling (namely, the discharge capacitor of the integrating circuit maintains the capacitance at the beginning of sampling).

Figure 7:
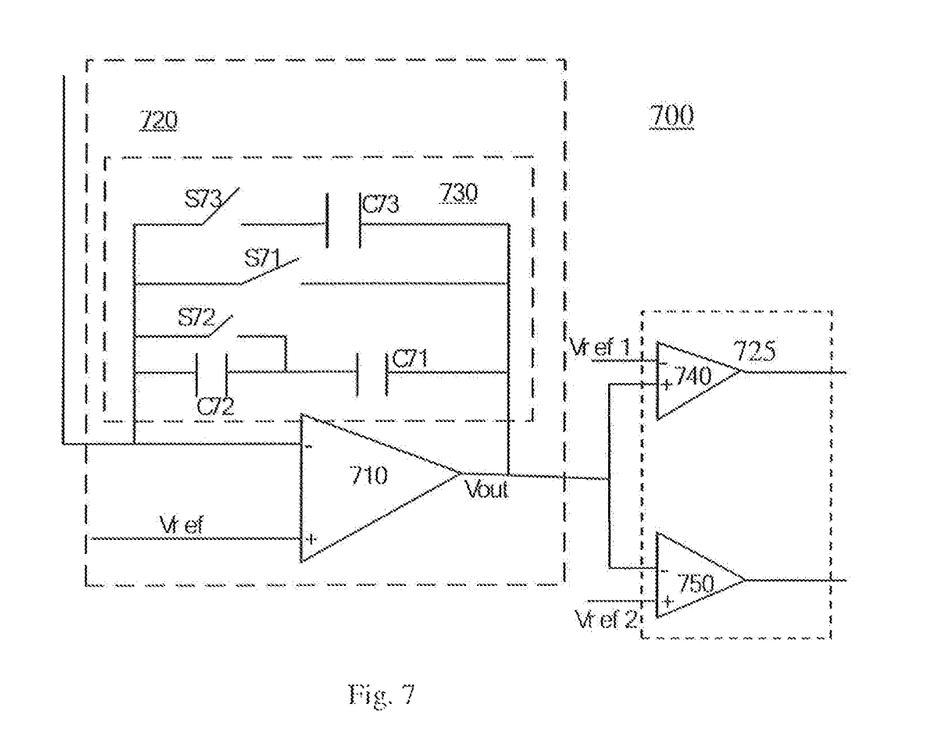
FIG. 7 is a schematic diagram of a circuit used for detecting a driving current of an organic light emitting diode display device based on a series-parallel-connected variable capacitor circuit provided by an embodiment of the present disclosure.

As illustrated in FIG. 7, an example of a circuit 700 used for detecting the driving circuit of the OLED comprises an integrating circuit 720 and a comparison circuit 725. The integrating circuit 720 comprises an operational amplifier 710 and a variable capacitor 730. The comparison circuit 725 comprises a first comparator 740 and a second comparator 750.

The difference between the integrating circuit 720 as illustrated in FIG. 7 and the integrating circuits as illustrated in FIG. 5 and FIG. 6 is the internal connection relationship of the sub-capacitors of the variable capacitor. The variable capacitor 730 as illustrated in FIG. 7 comprises a first switch S71, a first sub-capacitor C71, a second sub-capacitor C72, a second switch S72 connected with the second sub-capacitor C72 in parallel, a third sub-capacitor C73, and a third switch S73 connected with the third sub-capacitor C73 in series. In addition, the second sub-capacitor C72 and the first sub-capacitor C71 are connected between an inverting input end and an output end of the operational amplifier 710 in series. The third sub-capacitor C73 is connected between the inverting input end and the output end of the operational amplifier 710.

The comparison circuit 725 and the comparison circuit 525 as illustrated in FIG. 5 may adopt the same circuit structure. Also the connection relationship of the comparison circuit 725 and the integrating circuit 720 is also the same as that of the corresponding units in FIG. 5.

For example, the detail work process of the above mentioned circuit 700 used for detecting the driving current of the OLED is described below. At the beginning time, the first switch S71 and the second switch S72 are turned on, and the output voltage of the operational amplifier 710 is equal to the input voltage Vref of the non-inverting input end thereof. At the beginning of sampling, the first switch S71 is turned off, the driving current of the driving transistor charges the first sub-capacitor C71 by a sense transistor, and the output voltage Vout of the operational amplifier 710 begins to decrease from the input voltage Vref. After the predetermined time period T1, the output voltage of the operational amplifier 710 is compared with the first reference voltage Vref1 and the second reference voltage Vref2. If the output voltage Vout of the operational amplifier 710 is smaller than the second reference voltage Vref2, it is shown that the driving current is too large. Therefore, the third switch S73 are turned on at this time, and then the discharge capacitor of the integrating circuit 720 changes into a parallel capacitor formed of the first sub-capacitor C71 and the third sub-capacitor C73, so that the discharge time of the corresponding integrating circuit 720 is increased.

Correspondingly, if the output voltage Vout is greater than the reference voltage Vref1, it is shown that the driving current is smaller and the discharge time is too long. Therefore, at this time the second switch S72 is turned off, so that the discharge capacitor of the integrating circuit 720 changes into a series capacitor formed of the first sub-capacitor C71 and the second sub-capacitor C72, and then the discharge time of the corresponding integrating circuit 720 is shortened.

If the output voltage Vout is between the first reference voltage Vref1 and the second reference voltage Vref2, it is shown that the driving current is at an intermediate value, the discharge capacitor of the integrating circuit 720 keeps the capacitance value at the beginning of sampling.

In some embodiments, the first reference voltage Vref1, the second reference voltage Vref2, the capacitance of each sub-capacitor of the variable capacitor and the predetermined time period T1 can be adjusted to ensure that the discharge time of the integrating circuit be within a reasonable range for different driving currents. The total discharge time of the integrating circuit is T1+T2, where T1 is the predetermined time period and T2 is a variable value, and the size of T2 is determined by the capacitance value of the sub-capacitor after the variable capacitor is adjusted.

In some embodiments, the discharge time of the integrating circuit can be counted by a counter, so that the driving current is converted into a digital signal to output. In the data conversion process, each switch corresponding to each sub-capacitor can be controlled to turn on or off by a state bit outputted by the comparison circuit. Different state bits represent different discharge rates, and therefore the integrating circuit can still obtain a unique current even at the same discharge time by means of a certain mathematical calculation.

Figure 8:
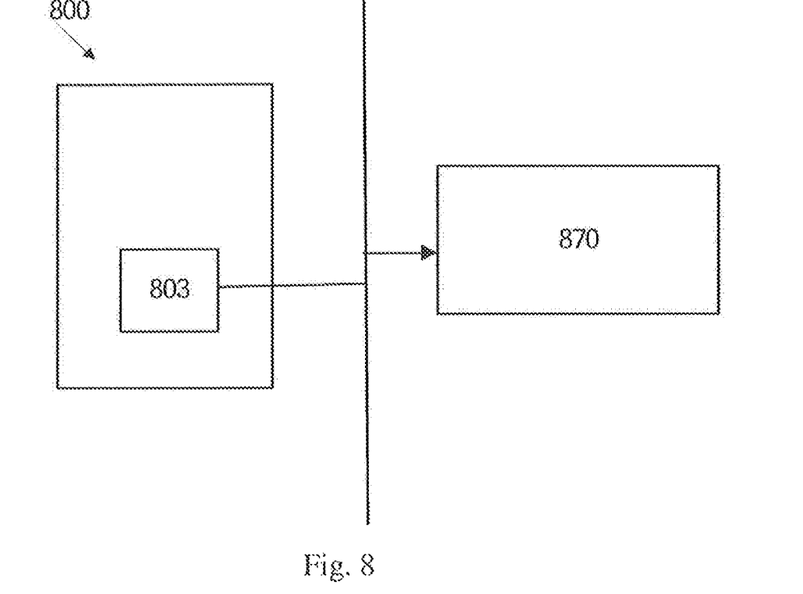
FIG. 8 is a block diagram of an organic light emitting diode display device provided by an embodiment of the present disclosure.

FIG. 8 illustrates an organic light emitting diode (OLED) display device 800 provided by an embodiment of the present disclosure. The OLED display device 800 comprises a plurality of sub-pixels, each sub-pixel comprises an organic light emitting diode (OLED) 803, the OLED display device 800 further comprises a circuit 870 used for detecting the driving current of the OLED of the sub-pixel, and the circuit 870 is used for detecting the driving current of the OLED 803.

Figure 9:
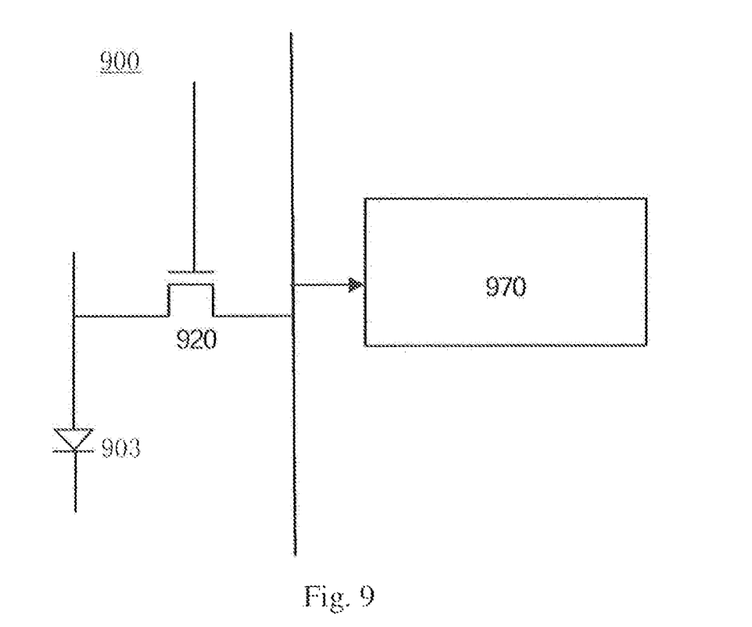
FIG. 9 is a structural diagram of another organic light emitting diode display device provided by an embodiment of the present disclosure.

FIG. 9 provides a structural diagram of another organic light emitting diode display device 900 comprising a detecting switch transistor. As illustrated in FIG. 9, the organic light emitting diode display device 900 further comprises the detecting switch transistor 920 (corresponding to the sense switch transistor T3 illustrated in FIG. 1B). The detecting switch transistor 920 is disposed between the OLED 903 and the circuit 970 used for detecting the driving current of the OLED. For example, a more specific exemplary structure of the sub-pixel circuit may be referred to FIG. 1B.

For example, the specific circuit structures of the above mentioned circuit 870 and circuit 970 used for detecting the driving current of the OLED may referred to the circuit structures as illustrated in FIG. 4-FIG. 7.

The embodiments of the present disclosure only relate to the structure which the embodiments of the present disclosure relate to, the other structures may be referred to the common design. Under the circumstance without conflict being incurred, various embodiments of the present disclosure and the different features of various embodiments can be combined with each other to obtain a new embodiment.

What are described above is related to the specific embodiments of the present disclosure only and not limitative to the scope of the disclosure, within the disclosed technical scope of the disclosure, the modification and replacement, which any skilled who is familiar with the technical field may easily conceive, should be covered within the scope of the protection of the disclosure. Therefore, the scopes of the disclosure are defined by the accompanying claims.

The application claims priority to the Chinese patent application No. 201610641431.5, filed Aug. 5, 2016, the entire disclosure of which is incorporated herein by reference as part of the present application.

What is claimed is:

1. A circuit used for detecting a driving current of an organic light emitting diode display device, comprising: an integrating circuit and a comparison circuit, wherein
the integrating circuit comprises an operational amplifier and a variable capacitor, the variable capacitor is connected between an inverting input end and an output end of the operational amplifier; and
the comparison circuit is connected to the integrating circuit to receive an output voltage of the integrating circuit at an end of a predetermined time period, and the comparison circuit further comprises a first comparator and a second comparator, wherein a non-inverting input end of the first comparator is configured to input a first reference voltage, and an inverting input end of the first comparator is configured to input the output voltage of the integrating circuit, and an inverting input end of the second comparator is configured to input a second reference voltage, and a non-inverting input end of the second comparator is configured to input the output voltage of the integrating circuit;
wherein the first comparator and the second comparator are configured to compare the output voltage with the first reference voltage and the second reference voltage, respectively, to obtain a voltage comparison result, wherein the second reference voltage is smaller than the first reference voltage; and
the integrating circuit is configured to reduce the capacitance of the variable capacitor of the integrating circuit according to only the voltage comparison result indicating that the output voltage is greater than the first reference voltage, and
increase the capacitance of the variable capacitor of the integrating circuit according to only the voltage comparison result indicating that the output voltage is smaller than the second reference voltage.

2. The circuit used for detecting the driving current of the organic light emitting diode display device according to claim 1, wherein,
the variable capacitor comprises a plurality of sub-capacitors, the plurality of sub-capacitors are connected with each other in parallel, in series or in series-parallel, and at least one of the plurality of sub-capacitors is configured to be disconnected from the variable capacitor or connected to the variable capacitor.

3. The circuit used for detecting the driving current of the organic light emitting diode display device according to claim 2, wherein the variable capacitor further comprises at least one switch element, the switch element is connected with a corresponding sub-capacitor in series or in parallel.

4. The circuit used for detecting the driving current of the organic light emitting diode display device according to claim 3, wherein,
the switch element is a transistor switch element.

5. The circuit used for detecting the driving current of the organic light emitting diode display device according to claim 1,
wherein the variable capacitor of the integrating circuit further comprises at least one sub-capacitor which is directly connected between the inverting input end and the output end of the operational amplifier.

6. An organic light emitting diode display device, comprising an organic light emitting diode and the circuit used for detecting the driving current of the organic light emitting diode display device according to claim 5,
wherein the circuit is configured for detecting the driving current of the organic light emitting diode.

7. The organic light emitting diode display device according to claim 6, further comprising a detecting switch transistor,
wherein the detecting switch transistor is disposed between the organic light emitting diode and the circuit configured for detecting the driving current of the organic light emitting diode display device.

8. The circuit used for detecting the driving current of the organic light emitting diode display device according to claim 1, further comprising a control circuit;
wherein the control circuit is configured to adjust the capacitance of the variable capacitor according to the comparison result outputted by the comparison circuit.

9. The circuit used for detecting the driving current of the organic light emitting diode display device according to claim 8,
wherein an output end of the first comparator or an output end of the second comparator is configured to output a flag bit data; and
the control circuit is configured to receive the flag bit data and adjusts the capacitance of the variable capacitor according to the flag bit data.

10. A method for detecting a driving current of an organic light emitting diode display device by using an integrating circuit and a comparison circuit, wherein,
the integrating circuit comprises an operational amplifier and a capacitor, the capacitor is connected between an inverting input end and an output end of the operational amplifier; and
the comparison circuit is connected to the integrating circuit to receive an output voltage of the integrating circuit, and the comparison circuit further comprises a first comparator and a second comparator, wherein a non-inverting input end of the first comparator is configured to input a first reference voltage, and an inverting input end of the first comparator is configured to input the output voltage of the integrating circuit, and an inverting input end of the second comparator is configured to input a second reference voltage, and a non-inverting input end of the second comparator is configured to input the output voltage of the integrating circuit;

the method comprising:

after detecting for a predetermined time period, obtaining the output voltage of the integrating circuit at an end of the predetermined time period;

comparing the output voltage with the first reference voltage and the second reference voltage, respectively, to obtain a voltage comparison result, wherein the second reference voltage is smaller than the first reference voltage; and reducing the capacitance of the capacitor of the integrating circuit according to only the voltage comparison result indicating that the output voltage is greater than the first reference voltage, and increasing the capacitance of the capacitor of the integrating circuit according to only the voltage comparison result indicating that the output voltage is smaller than the second reference voltage.

11. The method according to claim 10, comprising: adjusting the size of the predetermined time period, controlling a discharge time of the integrating circuit, wherein the discharge time of the integrating circuit is greater than the predetermined time period.

12. The method according to claim 10, wherein the capacitor of the integrating circuit is a variable capacitor, the variable capacitor comprises a plurality of sub-capacitors which are connected with each other in parallel, in series or in series-parallel, and at least one of the plurality of sub-capacitors is configured to be connected to the variable capacitor or disconnected from the variable capacitor.

13. The method according to claim 10, wherein, in the case that the output voltage is greater than the first reference voltage, a set first flag bit is used to represent a comparison result, a corresponding sub-capacitor is disconnected or connected according to information indicated by the comparison result; and in the case that the output voltage is smaller than the second reference voltage, a set second flag bit is used to represent the comparison result, the corresponding sub-capacitor is disconnected or connected according to the information indicated by the comparison result.

14. The method according to claim 10, further comprising: adjusting at least one among capacitance of the sub-capacitor of the variable capacitor, the first reference voltage and the second reference voltage, so as to adjust a discharge time of the integrating circuit.

* * * * *